US010866277B2

(12) United States Patent
Schat et al.

(10) Patent No.: US 10,866,277 B2
(45) Date of Patent: Dec. 15, 2020

(54) ANALOG-TEST-BUS APPARATUSES INVOLVING CALIBRATION OF COMPARATOR CIRCUITS AND METHODS THEREOF

(71) Applicant: NXP B.V., Eindhoven (NL)

(72) Inventors: Jan-Peter Schat, Hamburg (DE); Xiankun Jin, Austin, TX (US); Tao Chen, Austin, TX (US)

(73) Assignee: NXP B.V., Eindhoven (NL)

( * ) Notice: Subject to any disclaimer, the term of this patent is extended or adjusted under 35 U.S.C. 154(b) by 161 days.

(21) Appl. No.: 16/117,317

(22) Filed: Aug. 30, 2018

(65) Prior Publication Data
US 2020/0072900 A1 Mar. 5, 2020

(51) Int. Cl.
| | | |
|---|---|---|
| *G01R 31/00* | (2006.01) | |
| *G01R 31/3163* | (2006.01) | |
| *G01R 35/00* | (2006.01) | |
| *H03M 1/10* | (2006.01) | |
| *H03F 3/45* | (2006.01) | |

(52) U.S. Cl.
CPC ....... *G01R 31/3163* (2013.01); *G01R 35/005* (2013.01); *H03M 1/1009* (2013.01); *H03F 3/45179* (2013.01)

(58) Field of Classification Search
CPC . G01R 31/3163; G01R 31/3167; H03M 1/36; H03M 1/38; H03M 1/68; H03M 1/662; H03M 1/1009; H03M 1/1023; H03M 1/1028; H03K 3/011; H03K 3/023; H03F 3/45179
See application file for complete search history.

(56) References Cited

U.S. PATENT DOCUMENTS

| | | | | |
|---|---|---|---|---|
| 5,066,909 A | * | 11/1991 | Firooz | G01R 31/31724 324/121 R |
| 5,990,814 A | * | 11/1999 | Croman | H03K 5/2481 341/118 |
| 7,088,279 B2 | | 8/2006 | Muramatsu et al. | |
| 9,157,939 B2 | | 10/2015 | Kain et al. | |
| 9,356,615 B1 | | 5/2016 | Ranjbar et al. | |

(Continued)

OTHER PUBLICATIONS

L. Sumanen, M. Waltari, K. Halonen, "A mismatch insensitive CMOS dynamic comparator for pipeline A/D converters", The 7th IEEE International Conference on Electronics, Circuits and Systems, 2000. ICECS 2000.

(Continued)

*Primary Examiner* — Minh N Tang

(57) ABSTRACT

An example analog-test-bus (ATB) apparatus includes a plurality of comparator circuits, each having an output port, and a pair of input ports of opposing polarity including an inverting port and a non-inverting port, a plurality of circuit nodes to be selectively connected to the input ports of a first polarity, and at least one digital-to-analog converter (DAC) to drive the input ports of the plurality of comparator circuits. The apparatus further includes data storage and logic circuitry that accounts for inaccuracies attributable to the plurality of comparator circuits by providing, for each comparator circuit, a set of calibration data indicative of the inaccuracies for adjusting comparison operations performed by the plurality of comparator circuits.

20 Claims, 7 Drawing Sheets

(56) References Cited

U.S. PATENT DOCUMENTS 10,454,488 B1 * 10/2019 Monangi .............. H03K 5/2472
2014/0064355 A1    3/2014 Cho et al.
2016/0003914 A1    1/2016 Allen et al.

OTHER PUBLICATIONS

Y. Muramatsu et al., "A Signal-Procesisng CMOS Image Sensor Using a Simple Analog Operation," IEEE Journal of Solid-State Circuits, vol. 38, No. 1 (Jan. 2003).
IEEE 1149.4 Standard for a mixed-Signal Test Bus (2010).
Nanqi Liu, Shravan K. Chaganti, Zhigiang Liu and Degang Chen, Amitava Majumdar, "Concurrent Sampling with Local Digitization—An Alternative to Analog Test Bus," accepted and to be presented at IEEE 2018 ISCAS, Italy, May 2018.
Nitta, Y., "High-Speed Digital Double Sampling with Analog CDS on Column Parallel ADC Architecture for Low-Noise Active Pixel Sensor", 2006 IEEE International Solid-State Circuits Conference—Digest of Technical Papers, Feb. 6-9, 2006.

* cited by examiner

ANALOG-TEST-BUS APPARATUSES INVOLVING CALIBRATION OF COMPARATOR CIRCUITS AND METHODS THEREOF

OVERVIEW

Aspects of various embodiments are directed to analog-test-bus apparatuses and methods thereof involving calibration of comparator circuits for testing circuit nodes.

For accessing analog test points, analog-test-busses (ATBs) according to a standard can be used. The ATBs can include an analog-to-digital converter (ADC) that connects to one of a plurality of circuit nodes at a time, and sends output data to a compliant register for shift-out to an industry standard controller, such as a Joint Test Action Group (JTAG)-compliant controller. In such configurations, one circuit node is measured at a time. Additionally, as supply voltage and ground nodes can be connected to the ATB, there is a risk of accidental shorting.

These and other matters have presented challenges to efficiencies of analog-test-bus apparatuses implementations, for a variety of applications.

SUMMARY

Various example embodiments are directed to issues such as those addressed above and/or others which may become apparent from the following disclosure concerning analog-test-busses (ATBs) that calibrate the comparators for use in testing circuit nodes.

In certain example embodiments, aspects of the present disclosure involve an ATB apparatus that includes at least one digital-to-analog converter (DAC) that provides a rising or falling reference voltage used to test each of the circuit nodes at one time by comparator circuits comparing the reference voltage against the voltage of the circuit nodes. Such embodiments include a comparator circuit per circuit node, which can be imprecise and below a threshold in size, and are made precise by calibrating the comparator circuits using the ATB apparatus.

In a more specific example embodiment, an ATB apparatus includes a plurality of comparator circuits, a plurality of circuit nodes, at least one DAC, and data storage and logic circuitry. The plurality of comparator circuits each having an output port and a pair of input ports of opposing polarity including an inverting port and a non-inverting port. In specific embodiments, the plurality of comparator circuits include differential-to-single amplifiers or differential comparators. The plurality of circuit nodes are to be selectively connected to the input ports of the first polarity for testing the circuit nodes. The at least one DAC drives the inputs ports of the plurality of comparator circuits. For example, the ATB apparatus can include a first DAC that drives the plurality of comparator circuits using differential reference lines that are selectively connected to input ports of the first polarity and a second DAC that drives the plurality of comparator circuits using differential reference lines connected to input ports of the opposite polarity. The data storage and logic circuitry (e.g., register and JTAG-compliant controller) account for inaccuracies attributable to the plurality of comparator circuits by providing, for each comparator circuit, a set of calibration data indicative of the inaccuracies for adjusting comparison operations performed by the plurality of comparator circuits.

The set of calibration data, for each of the comparator circuits, can be provided by the data storage and logic circuitry based on combinations of input codes of the first DAC and the second DAC and resulting comparator outputs for the combinations. The data storage and logic circuit can use the sets of calibration data to test the circuit nodes. For example, the sets of calibration data can be used to mitigate inaccuracy of the transfer function of at least one of the plurality of comparator circuits by adjusting the comparator outputs during a test of the circuit nodes. In various embodiments, the data storage and logic circuit can detect a fault responsive to the test of the plurality of node circuits and can perform a dedicated action selected from the group consisting of resetting the ATB apparatus, rebooting a system associated with the ATB apparatus, raising an error flag, and combinations thereof. The data storage and logic circuitry can periodically (e.g., at each start up, every minute, etc.) calibrate the plurality of comparator circuits using respective comparator circuit outputs for combinations of input codes of the first DAC and the second DAC.

In another specific example embodiment, an ATB apparatus includes a plurality of comparator circuits, a plurality of circuit nodes, a DAC, and data storage and logic circuitry. Each of the plurality of comparator circuits has an output port, and a pair of input ports of opposing polarity including an inverting port and a non-inverting port. The plurality of circuit nodes are to be connected to the input ports of a first polarity. The DAC drives the plurality of comparator circuits by connecting to input ports of the opposite polarity. In other specific example embodiments, the ATB apparatus can further include another DAC that drives the plurality of comparator circuits by selectively connecting to the input ports of the first polarity. And, the data storage and logic circuitry account for inaccuracies attributable to the plurality of comparator circuits by using sets of calibration data indicative of the inaccuracy to adjust comparison operations performed by the plurality of comparator circuits. The sets of calibration data include tables having combinations of input codes of the DAC and another DAC and resulting comparator outputs associated with the combinations. The data storage and logic circuitry is configured and arranged with the plurality of comparators circuits to test the plurality of circuit nodes by comparing outputs of the DAC to outputs of the plurality of circuit nodes and adjusting the comparison operations performed by the plurality of comparator circuits using the sets of calibration data to mitigate the inaccuracies. For example, the plurality of circuit nodes can be tested by using the sets of calibration data to mitigate inaccuracies of the transfer function of at least one of the plurality of comparator circuits.

In various related embodiments, the above-described ATB apparatus can further include a plurality of flip-flop circuits, latches and/or random-access memory (RAM) cells. The flip-flop circuits, latches and/or RAM cells are coupled to the output ports of the plurality of comparator circuits, and latch in response to a rising or active edge of an output at the output port of the comparator. The DAC input code can be distributed over a digital bus having the n-bits. Each of the plurality of comparator circuits is associated with n flip-flop circuits, latches and/or RAM cells and in other embodiments at least one of the plurality of comparator circuits can be associated with less than n flip-flop circuits, latches and/or RAM cells.

Various embodiments are directed to an ATB apparatus that includes a plurality of comparator circuits, a first DAC, a second DAC, a plurality of circuit nodes, and data storage and logic circuitry. Each of the plurality of comparator circuits have an output port, and a pair of input ports of opposing polarity including an inverting port and a non-inverting port. The first DAC drives the plurality of comparator circuits by connecting to input ports of a first polarity. The second DAC drives the plurality of comparator circuits by connecting to input ports of an opposite polarity. The plurality of circuit nodes are to be selectively connected to the input ports of the first polarity. The ATB apparatus can include switch circuitry that selectively connects the first DAC to the input ports of the first polarity for calibration and selectively connects the plurality of circuit nodes to the input ports of the first polarity for testing the plurality of circuit nodes. The data storage and logic circuitry account for inaccuracies attributable to the plurality of comparator circuits by providing sets of calibration data indicative of the inaccuracies and using the sets of calibration data to adjust comparison operations performed by the plurality of comparator circuits. As previously described, the data storage and logic circuitry provides the sets of calibration data based on combinations of input codes of the first DAC and the second DAC and resulting comparator outputs for each of the combinations.

In a number of related and more-specific embodiments, the ATB apparatus further includes switch circuitry that selectively connects one of the plurality of node circuits to the first DAC during a test of the plurality of node circuits. The first DAC can stimulate the node circuit during the test of the plurality of node circuits. In other embodiments and/or in addition, the ATB apparatus can further include a plurality of flip-flop circuits, latches and/or RAM cells coupled to the output ports of the plurality of comparator circuits. The plurality of flip-flop circuits, latches and/or RAM cells can latch in response to a rising or active edge of an output at the output port of the comparator. In various embodiments, the DAC input code is distributed over a digital bus having the n-bits and at least one of the plurality of comparator circuits is associated with less than n flip-flops, latches and/or RAM cells.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
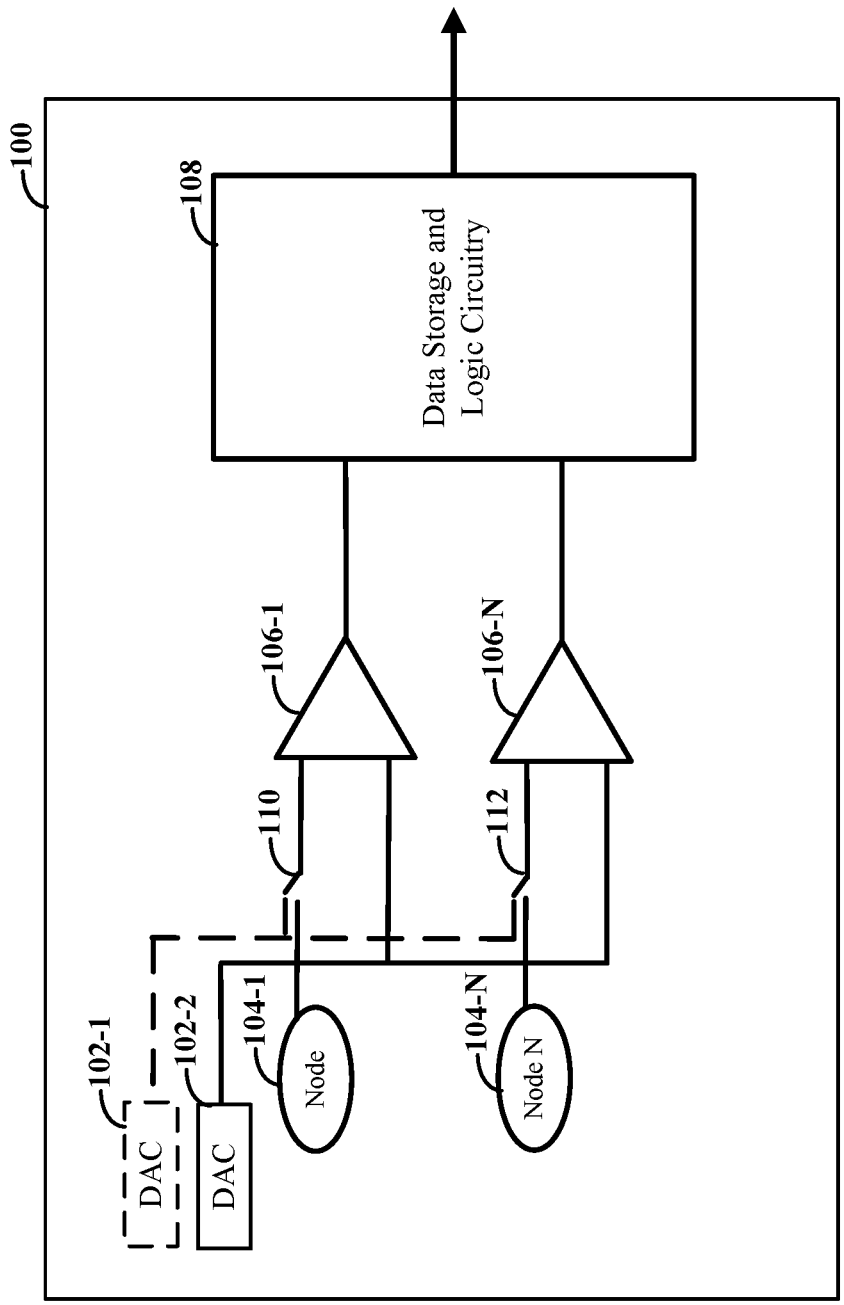
FIG. 1 illustrates an example of an ATB apparatus, in accordance with various embodiments.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving analog-test-busses (ATBs) that calibrate the comparator circuits for use in testing circuit nodes. In certain implementations, aspects of the present disclosure have been shown to be beneficial when used in the context of an ATB apparatus that includes at least one digital-to-analog converter (DAC) that provides a rising or falling reference voltage used to test each of the circuit nodes at one time by comparator circuits comparing the reference voltage against the voltage of the respective circuit node. In some embodiments, the ATB apparatus includes a comparator circuit per circuit node, which can be precise and below a threshold in size, by calibrating the comparator circuits using the ATB apparatus. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Analog-test-busses (ATBs) can be used to access analog test points, sometimes herein referred to as circuit nodes. In some implementations, an analog to digital converter (ADC) is selectively connected to each circuit node, where the ADC sends its output data to a compliant registers for shift-out to a protocol compliant controller, such as a compliant register for shift-out to an industry standard controller, such as a Joint Test Action Group (JTAG)-compliant controller. The use of the ADC can include one measurement (e.g., one node) at a time and can have risk of shorting. For example, in the instance of nearby Vdd node and a ground node, there can be risk of accidental shorting. This can be overcome by high-ohmic ATB switches, or a strict one-hot and break-before behavior-make, including during start-up and supply voltage levels. In some embodiments, a digital to analog converter (DAC) can be used to provide a rising or falling reference voltage (Vref) and local comparator circuits can compare the reference voltage against the voltage of the circuit node under test. Each of the circuit nodes can be tested in parallel, and the risk of shorting can be mitigated. However, use of the DAC can present a number of issues. For example, the connections from the circuit nodes and the DAC to the comparator circuits can be susceptible to parasitic noise due to cross-talk from neighboring wires and/or due to electromagnetic waves from inside or outside the integrated circuit (IC). Additionally, the Vref line and connection from each circuit node to the comparator circuits can be susceptible to ground bounce (e.g., the difference of a DAC ground verses the comparator ground and/or difference of the node ground and the comparator ground). As another example, in order to provide parallel measurements, one comparator circuit per circuit node is used. As there can be thousands of circuit nodes, there can thus be thousands of comparator circuits used. In many implementations, either the comparator circuits are precise, and take up significant IC area, or they are small and imprecise. As used herein, imprecise includes or refers to having an offset of 0V input voltage and having different gains at the signal and the reference input. The data transfer rate after each DAC step can disturb the power grid, and even if digital-to-analog supplies and grounds are separated, the ground bounce or cross-talk over the substrate can lead to disturbing analog supplies during the digital shift-out. While fast low-drop out regulators (LDOs) can limit the disturbance to a few microseconds or less, the sensitive analog circuit nodes can take longer to recover from such a Vdd drop. Embodiments in accordance with the present disclosure can include use of imprecise (and small) comparator circuits in an ATB apparatus that involves measuring all of the circuit nodes in parallel and that accounts for inaccuracies attributable to the comparators circuits using sets of calibration data. For example, there can be a set of calibration data for each of the comparator circuits that is indicative of the inaccuracy and used to adjust comparison operations performed by the comparator circuits. The sets of calibration data is thereby used to calibrate the comparator circuits.

In a number of embodiments, the sets of calibration data can be derived using two DACs. A first DAC, can be referred to as the calibrating DAC, is selectively coupled to the comparator circuits for performing calibration. The second DAC, which can be referred to as a measuring DAC, is coupled to the comparator circuits for performing both calibration and measuring the node circuits. Both DACs can drive an input port of the comparator circuits. As may be appreciated, the comparator circuits have an output port and a pair of opposing polarity input ports, e.g., an inverting input port and a non-inverting input port. The first DAC is selectively connected to the input ports of a first polarity and the second DAC is connected to the input ports of the second polarity. The first DAC and circuit nodes, in such embodiments, are selectively connected to the comparator circuits and is used to calibrate the comparator circuits. For calibration, all combinations of input codes for the first DAC and second DAC are provided and the resulting comparator outputs (e.g., 0 or 1) are determined. The result of the calibration includes a first DAC input code/second DAC input code calibration table for each comparator circuit. A set of calibration data is provided for each comparator circuit and used when measuring and/or testing the node circuits.

In a number of specific embodiments, the ATB apparatus includes the plurality of comparator circuits, a plurality of circuit nodes, at least one DAC, and data storage and logic circuitry. The plurality of comparator circuits each have an output port and a pair of input ports of the opposing polarity, including an inverting port and non-inverting port. In specific embodiments, the comparator circuits include differential-to-single amplifiers and/or differential comparators. The plurality of circuit nodes are selectively connected, e.g., via differential lines, to the input ports of the first polarity. The at least one DAC drives the input ports of the plurality of comparator circuits. For example, the at least one DAC can include a first DAC that drives the plurality of comparator circuits using differential reference lines selectively connected to the input ports of the first polarity and a second DAC that drives the plurality of comparator circuits using differential reference lines connected to the input ports of the second polarity. Although embodiments are not so limited. The data storage and logic circuitry can account for inaccuracies attributable to the plurality of comparator circuits by providing, for each comparator circuit, a set of calibration data indicative of the inaccuracies for adjusting comparison operations performed by the comparator circuits. The data storage and logic circuit, which include registers and a controller, can provide the sets of calibration data based on combinations of input codes of the first DAC and the second DAC and resulting comparator outputs for the combinations.

In various embodiments, the data storage and logic circuit tests the plurality of circuit nodes using the sets of calibration data. The sets of calibration data, for example, can be used to mitigate inaccuracy of a transfer function of at least of the plurality of comparator circuits, such as offset error and gain error. The calibration can be performed at a manufacturer, performed and applied to a plurality of ICs, and/or can be performed periodically, such as at each start up or every minute, to calibrate the plurality of comparator circuits using the respective comparator circuit outputs for the combinations of input codes of the first DAC and the second DAC.

In various embodiments, the ATB apparatus may include one DAC and/or may not perform the switching between the second DAC and the circuit nodes. For example, the ATB apparatus may include the sets of calibration data based on or obtained during manufacturing and/or calibration of a similarly implemented IC. In such embodiments, the apparatus includes the plurality of comparator circuits, the plurality of circuit nodes, the DAC, and the data storage and logic circuitry. The plurality of comparator circuits each have an output port and a pair of input ports of the opposing polarity. The plurality of circuit nodes are to be connected, e.g., via differential lines, to the input ports of the first polarity. The DAC drives the plurality comparator circuits by connecting to input ports of the opposite polarity. The data storage and logic circuitry account for inaccuracies attributable to the plurality of comparator circuits by using the sets of calibration data indicative of the inaccuracy to adjust comparison operations performed by the plurality of comparator circuits. The sets of calibration data can be externally obtained or can be derived using a second DAC, as described above.

In specific embodiments, the data storage and logic circuitry is arranged with the plurality of comparators circuits to test the plurality of circuit nodes by comparing outputs of the DAC to outputs of the plurality of circuit nodes (e.g., compare Vref to circuit node voltage outputs) and adjusting the comparison operations performed by the plurality of comparator circuits using the set of calibration data to mitigate the inaccuracies. The data storage and logic circuitry can test the plurality of circuit nodes using the set of calibration data to mitigate inaccuracy of the transfer function of at least one of the plurality of comparator circuits. The sets of calibration data include tables having combinations of input codes of the DAC and another DAC and resulting comparator outputs associated with the combinations.

In a number of related embodiments, the ATB apparatus further includes a plurality of flip-flop circuits, latches and/or random-access memory (RAM) cells coupled to the output ports of the plurality of comparator circuits. The plurality of flip-flop circuits, latches and/or RAM cells can latch in response to a rising or active edge of an output at the output port of the respective comparator circuit. The DAC input code can be distributed over a digital bus having the n-bits. In some more specific embodiments, at least one of the plurality of comparator circuits is associated with less than n flip-flop circuits, latches and/or RAM cells. In some more specific embodiments, the ATB apparatus additionally includes switch circuitry that selectively connects one of the plurality of node circuits to the other (e.g., calibrating) DAC circuit, during a test of the plurality of node circuits, to stimulate the one node circuit.

In various specific embodiments, the ATB apparatus includes the plurality of comparator circuits, the first DAC, the second DAC, the plurality of circuit nodes, and the data storage and logic circuitry, as described above. In such embodiments, the first DAC drives the plurality of comparator circuits by connecting to input ports of the first polarity, the second DAC drives the plurality of comparator circuits by connecting to input ports of the opposite polarity, and the plurality of circuit nodes are selectively connected to the input ports of the first polarity. The ATB apparatus can include switch circuitry that selectively connects the first DAC to the input ports of the first polarity for calibration and selectively connects the plurality of circuit nodes to the input ports of the first polarity for testing the plurality of circuit nodes. And, as previously described, the data storage and logic circuitry provide the set of calibration data based on combinations of input codes of the first DAC and the second DAC and resulting comparator outputs for each of the combinations.

Turning now to the figures, FIG. 1 illustrates an example ATB apparatus, in accordance with various embodiments. The ATB apparatus 100 includes a plurality of comparator circuits 106-1, 106-N and a plurality of circuit nodes 104-1, 104-N. The ATB apparatus 100 further includes at least one DAC 102-2 that drives the input ports of the plurality of comparator circuits 106-1, 106-N for testing the circuit nodes 104-1, 104-N. The at least one DAC 102-2 can provide a reference voltage Vref that rises (slowly), which is compared to output voltages of the circuit nodes 104-1, 104-N. As further illustrated herein, the plurality of comparator circuits 106-1, 106-N can include differential-to-single amplifiers and/or differential comparators.

Each of the comparator circuits 106-1, 106-N includes an output port and a pair of input ports of opposing polarity, including an inverting port and a non-inverting port. The at least one DAC 102-1, 102-2 can drive the input ports of the plurality of comparator circuits 106-1, 106-N. The plurality of circuit nodes 104-1, 104-N can drive the input ports of a first polarity and the DAC 102-2 can drive the input ports of the other polarity. The ATB apparatus 100, as may be appreciated, is an IC that includes a comparator circuit per node circuit, and which can be used to test the circuit nodes 104-1, 104-N in parallel.

In various embodiments, the ATB apparatus 100 includes a first DAC 102-1 and a second DAC 102-2. The two DACs 102-1, 102-2 can be used to calibrate the plurality of comparator circuits 106-1, 106-N for potential inaccuracies. The first DAC 102-1 can drive the plurality of comparator circuits 106-1, 106-N using differential lines selectively connected to input ports of the first polarity for calibration and the second DAC can drive the plurality of comparator circuit 106-1, 106-N using differential lines connected to input ports of the opposite polarity for both calibration and testing of the node circuits 104-1, 104-N. As illustrated, switch circuitry 110, 112 can be used to selectively connect the node circuits 104-1, 104-N or the first DAC 102-1 to the input port of the first polarity of the comparator circuits 106-1, 106-N. For ease of reference, the first DAC is herein interchangeably referred to as the calibration DAC and the second DAC is interchangeably referred to as the measuring DAC. Additionally, the node circuits are referred to as nodes and the comparator circuits are referred to as comparators.

The ATB apparatus 100 further includes data storage and logic circuitry 108. The data storage and logic circuitry 108 can include registers and an industry standard controller, such as a Joint Test Action Group (JTAG)-compliant controller. As may be appreciated, the comparators 106-106-N send output data to the register for shift-out to the JTAG-compliant controller during both the calibration of the comparators 106-1, 106-N and testing of the nodes 104-1, 104-N. The data storage and logic circuitry 108 can account for inaccuracies attributable to the plurality of comparator circuits by providing, for each comparator circuit, a set of calibration data indicative of the inaccuracies for adjusting comparison operations performed by the plurality of comparator circuits. The sets of calibration data are based on combinations of input codes of a first DAC and a second DAC and resulting comparator outputs for the combinations. For example, each set of calibration data can include a table of the input codes of the calibration DAC and measuring DAC and the resulting comparator output. As may be appreciated by one of ordinary skill, the DAC input codes correspond to the voltage outputs.

The data storage and logic circuitry 108 can test the plurality of circuit nodes using the sets of calibration data to mitigating inaccuracy of the transfer function of at least one of the plurality of comparator circuits, such as mitigating offset error and/or gain error inaccuracies. For example, the nodes 104-1, 104-N can be tested by comparing the input code of the measuring DAC 102-2 to the output of the respective comparators 106-1, 106-N, which is used to identify the circuit node output voltage by adjusting the comparison operation performed by the comparators 106-1, 106-N using the sets of calibration data (e.g., compare Vref to the comparator output to determine the circuit node output voltage). In some specific embodiments, the data storage and logic circuitry 108 can periodically calibrate the comparators 106-1, 106-N using the respective comparator outputs for combinations of input codes of the DACs 102-1, 102-2. The periodic calibration can occur at each startup of the IC, every minute or second, among other durations. In specific embodiments, the register values can be shifted out of the register (e.g., an Institute of Electrical and Electronics Engineers (IEEE) 1687-compliant register) and the JTAG-compliant controller can evaluate the register values according to the set of calibration data for each of comparators 106-1, 106-N to evaluate the node voltages obtained. In response to a fault and based on the test, a dedicated action can be performed, such as resetting the IC, rebooting the whole system, and/or raising an error flag.

As further illustrated by FIGS. 2-6B, embodiments include a number of variations. In some embodiments, the ATB apparatus includes both the calibrating and measuring DACs, with the calibrating DAC and the nodes selectively coupling to the non-inverting input ports of the comparators, although embodiments are not so limited and the calibrating DAC and nodes can couple to the inverting input ports and the apparatus can include only one DAC that is calibrated such as by the manufacturer. In other embodiments, the ATB apparatus can further include a plurality of flip-flop circuits, latches and/or RAM cells that latch in response to a rising or active edge of an output port of the comparator. For example, the DAC input code can be distributed over a digital bus having n-bits and each of the plurality of comparators can be associated with n flip-flop circuits, latches and/or RAM cells. In other embodiments, one or more the plurality of comparators can be associated with less than n flip-flop circuits, latches and/or RAM cells. The ATB apparatus can additionally include switch circuitry that selectively connects one of the plurality of nodes to the calibrating DAC, during a test of the plurality of node, and which is used stimulate the node.

Figure 2:
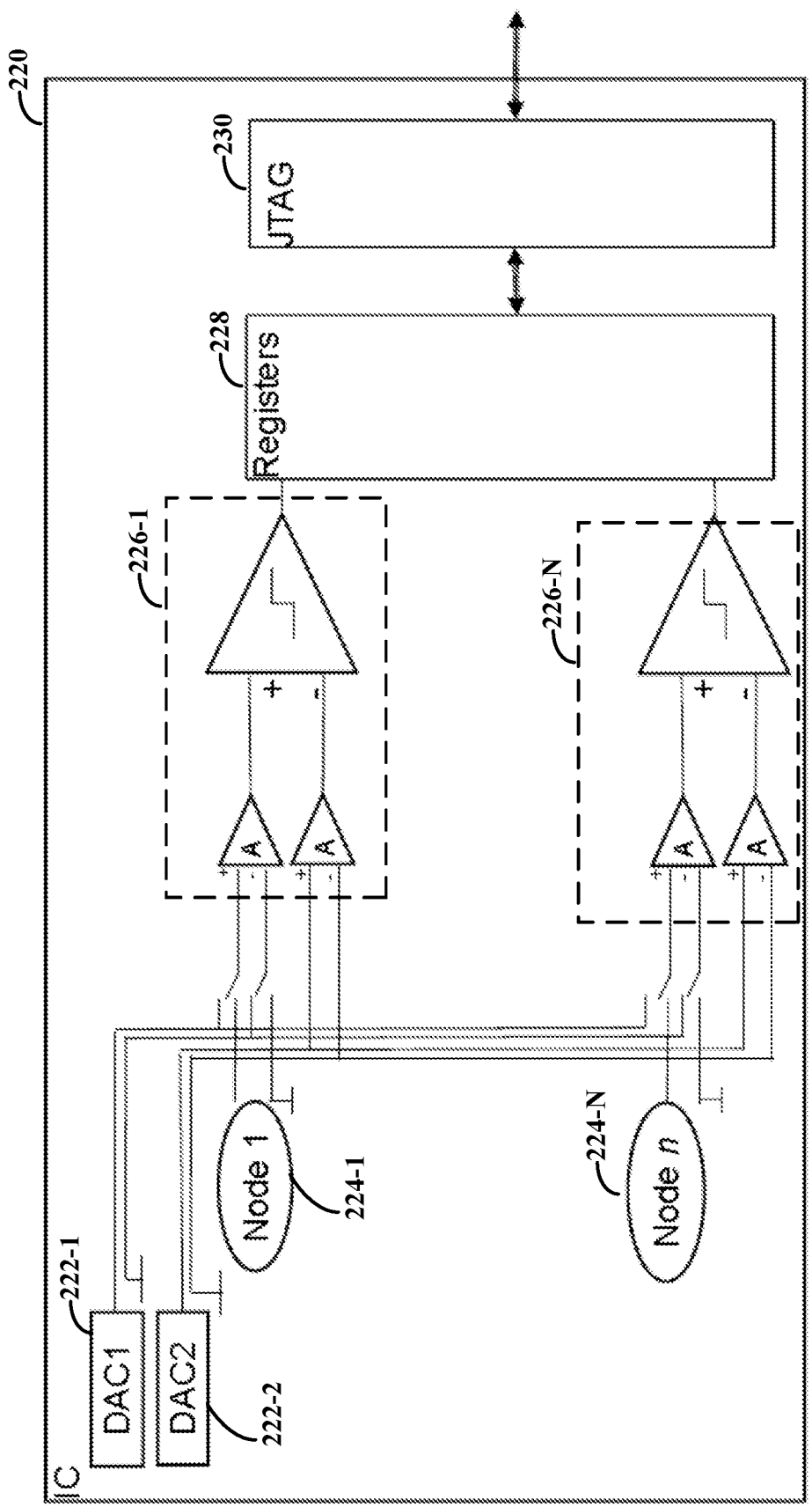
FIG. 2 illustrates an example of an ATB apparatus, in accordance with various embodiments.

FIG. 2 illustrates an example of an ATB apparatus, in accordance with various embodiments. The ATB apparatus 220 includes an IC having a measuring DAC 222-2 that provides the rising or falling Vref and comparator circuits for comparing the Vref against the voltage of the nodes 224-1, 224-N. All of the nodes 224-1, 224-N are tested in parallel.

The comparators 226-1, 226-N can be calibrated using a calibration technique, as previously described. As illustrated by FIG. 2, the ATB apparatus 220 includes the measuring DAC 222-2 and the calibrating DAC 222-1. Both DACs 222-1, 222-2 having differential reference lines which can be connected to the comparators 226-1, 226-N for driving the respective input ports. In the specific embodiments, the measuring DAC 222-2 has differential reference lines connected to the inverting input ports of the comparators 226-1, 226-N and the calibrating DAC 222-1 selectively has differential lines connected to the non-inverting input ports of the comparators 226-1, 226-N. As further illustrated herein, the nodes 224-1, 224-N can have differential lines that are selectively connected to the non-inverting input ports, and which are used to test the nodes 224-1, 224-2. As both the reference lines from the DACs 222-1, 222-2 and the lines from the nodes 224-1, 224-N to the comparators 226-1, 226-N are differential (e.g., referred to with respect to ground) such embodiments can mitigate the risk of or susceptibility to parasitic noise due to cross-talk from neighboring wires or due to electromagnetic waves from inside or outside the IC and ground bounce.

By using the two DACs 222-1, 222-2, any possible combination of input voltage can be applied to both of the comparator input ports. This can allow for a complete calibration of the comparators 226-1, 226-2 by covering all combinations of input voltages on each input port of each of the comparators 226-1, 226-2, and which can allow for use of imprecise comparators that take up less IC area than precise comparators.

The registers 228 and JTAG-compliant controller 230 can account for inaccuracies attributable to the plurality of comparator circuits by providing sets of calibration data indicative of the inaccuracies and by using the sets of calibration data to adjust comparison operations performed by the plurality of comparator circuits. For example, the registers 228 and JTAG-compliant controller 230 can be used to provide the sets of calibration data based on the combinations of input codes for the two DACs 222-1, 222-2 and the resulting comparator outputs for each of the combinations. The calibration can be performed before production testing, before each run in the field, and/or other period times. The calibrating DAC 222-1 and the nodes 224-1, 224-N can be selectively connected, using switch circuitry, to the input port of the comparators 226-1, 226-N for respectively providing calibration and for testing the nodes 224-1, 224-N.

As a specific example, for calibration, each of the switches associated with the differential references lines of the calibrating DAC 222-1 and the differential lines of the nodes 224-1, 224-N are in a first position (e.g., upper position) used to connect the differential reference lines of the calibrating DAC 222-1 to the respective input port (e.g., the non-inverting input port) of the comparators 226-1, 226-2. The differential reference lines of the measuring DAC 222-2 are connected to the other input ports of the comparators 226-1, 226-2 for both calibration and testing. The registers 228 and JTAG-compliant controller 230 are used to determine the comparator outputs for each comparator 226-1, 226-N (e.g., 0 or 1) for all combinations of input codes for the calibrating DAC 222-1 and the measuring DAC 222-2. In some embodiments, the DACs 222-1, 222-2 can be high precision and the calibration can be in a particular range (e.g., small range). The result of the calibration is the set of calibration data for each of the comparators 226-1, 226-N, such as calibrating DAC/measuring DAC table for each of the comparators.

To test the nodes 224-1, 224-N, such as during production testing or a built-in self-test, each of the switches associated with the differential references lines of the calibrating DAC 222-1 and the differential lines of the nodes 224-1, 224-N are in a second position (e.g., lower position) used to connect the differential lines of the nodes 224-1, 224-2 to the respective input port (e.g., the non-inverting input port) of the comparators 226-1, 226-N. The node voltages, which are referred to their local ground and converted locally to single-ended voltages, are compared to the voltages of the measuring DAC 222-2 (e.g., the DAC2 voltages) by the comparators 226-1, 226-N. Using the sets of calibration data for the comparators 226-1, 226-N, the corresponding calibrating voltage can be determined which is equal to the node voltage. Accordingly, the sets of calibration data can be used to account for the inaccuracies of the comparators 226-1, 226-N.

The embodiments of FIG. 2 (as well as FIGS. 3-5) illustrate comparators that include at least one of differential-to-single amplifiers. Although embodiments are not so limited and the comparators can include differential comparators, such as those illustrated by FIG. 6B. Additionally, although the embodiments of FIGS. 2-5 illustrate the calibrating DAC/nodes being selectively connected to the non-inverting input ports of the comparators and the measuring DAC connected to the inverting input ports, embodiments are not so limited and the calibrating DAC/nodes can be selectively connected to the inverting input ports of the comparators and the measuring DAC connected to the non-inverting input ports.

Figure 3:
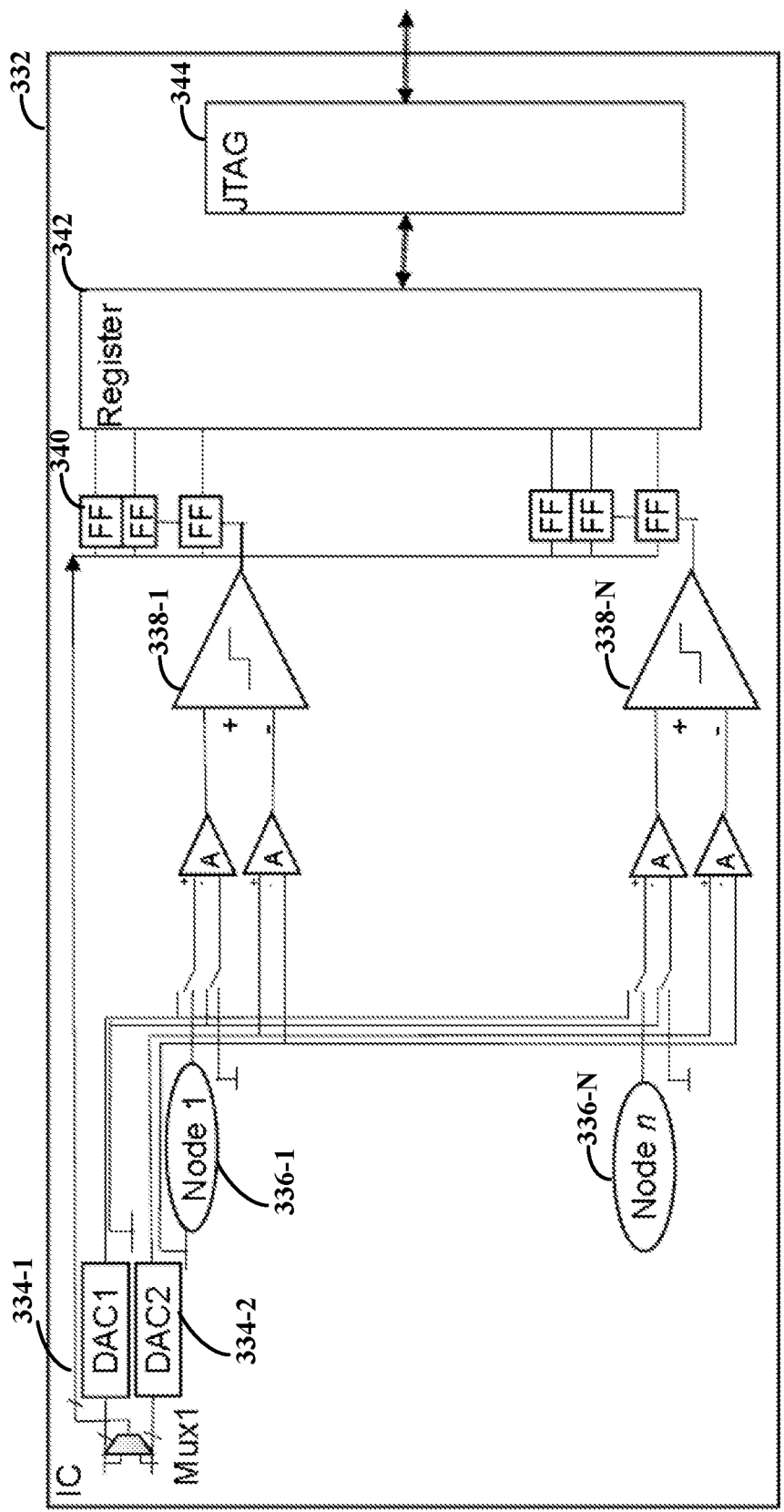
FIG. 3 illustrates an example of an ATB apparatus, in accordance with various embodiments.

FIG. 3 illustrates an example of an ATB apparatus, in accordance with various embodiments. The ATB apparatus 332 can include the components of the ATB apparatus 220 illustrated by FIG. 2 with the addition of flip-flop circuits. That is, the ATB apparatus 332 includes an IC having a measuring DAC 334-2 that provides the rising or falling Vref and comparators 338-1, 338-N for comparing the Vref selectively against the voltage outputs of the calibrating DAC 334-1 for calibration, and the voltage of the nodes 336-1, 336-N for testing. Each of the nodes 336-1, 336-N are tested in parallel. The various components are not repeated but include the above described circuit components that provide the above-described functionality.

The ATB apparatus 332 of FIG. 3, differs from the ATB apparatus 220 of FIG. 2 in the way that the comparator outputs are processed. In various embodiments, the DAC input code is distributed over a bus line having n-bits (e.g., n bit wide for an n-bit DAC). Each of the comparators 338-1, 338-2 is provided with an n-bit register, such as via the flip-flop circuits (e.g., as illustrated by FF 340), although embodiments are not so limited and can include latches and/or RAM cells. The flip-flop circuits latch in response to a rising or active edge of an output at the output port of the respective comparator, e.g., comparator 338-1 for FF 340. For example, once a comparator output goes to 1 (or to 0 in various embodiments) for the first time during a DAC ramp (e.g., slow rise of Vref), the register is loaded with the DAC code (e.g., the comparator output clocks the register) by the flip-flop circuits. Such embodiments include additional circuitry associated with the n-bit register for each node (e.g., the flip-flop circuits), however, the register 342 can be read out by the JTAG-compliant controller 344 after the whole DAC range, rather than after each DAC step. As data transfer after each DAC step is not performed, disruption of the power grid due to the data transfer is mitigated or avoided. And, the digital Vss bounce can be reduced in addition to the read-out data count and read-out time by using the n-bit register.

In some specific embodiments with an n-bit register, the calibration of the comparators 338-1, 338-2 can involve two separate and consecutive runs. The first run can shift out the calibrating DAC input codes (e.g., DAC1 334-1) and the second run can shift out the measuring DAC input codes (e.g., DAC2 334-2) depending on the setting the multiplexer (e.g., Mux 1).

Figure 4:
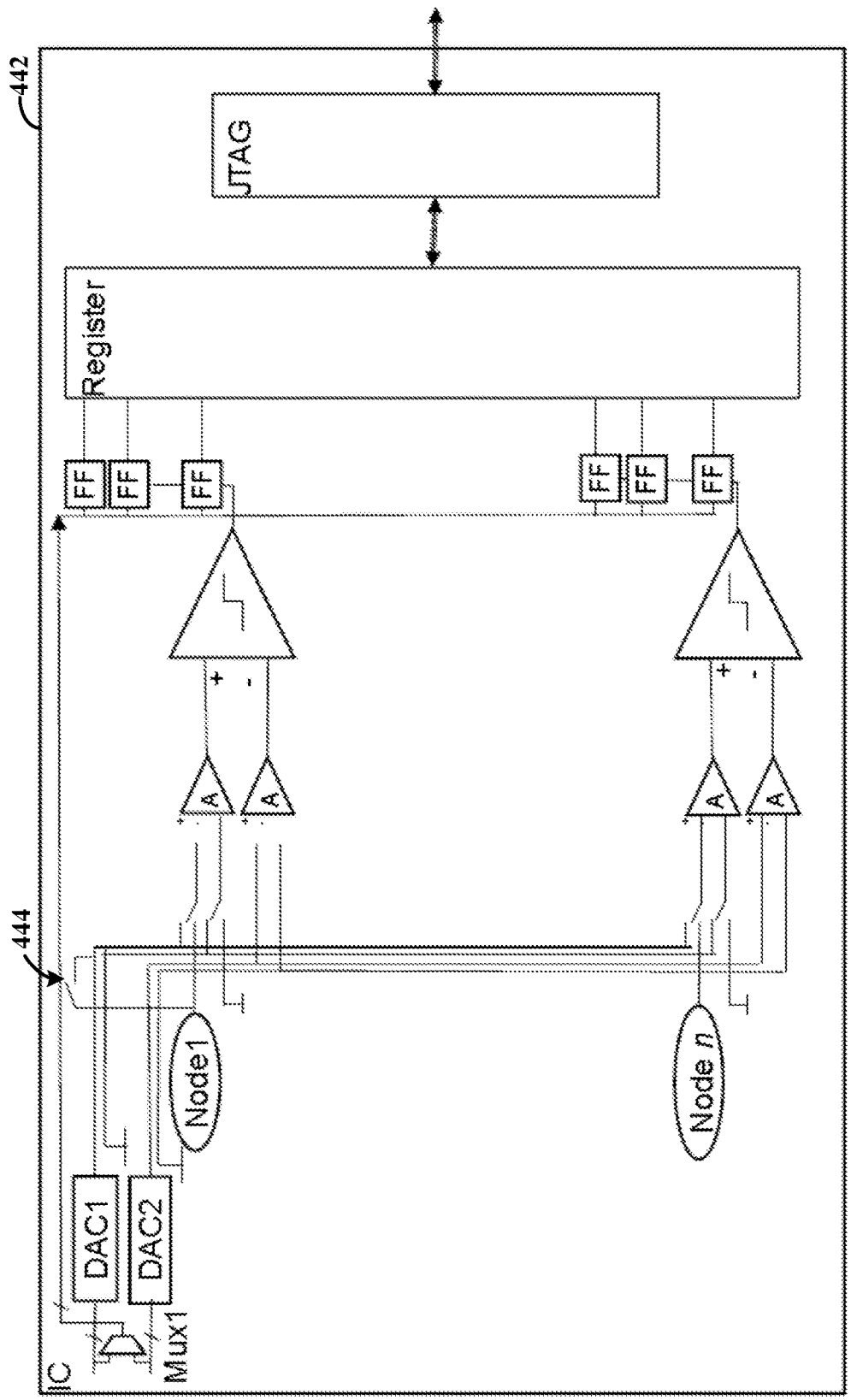
FIG. 4 illustrates an example of an ATB apparatus, in accordance with various embodiments.

FIG. 4 illustrates an example of an ATB apparatus, in accordance with various embodiments. The ATB apparatus 442 can include the components of the ATB apparatus 220 illustrated by FIG. 2 with the addition of flip-flop circuits and the components of the ATB apparatus 334 of FIG. 3 that includes a modification to the testing of the nodes. Although embodiments are not so limited and can include flip-flop circuits, latches and/or RAM cells. The ATB apparatus 442 includes an IC having a measuring DAC (e.g., DAC2) that provides the rising or falling Vref and comparators for comparing the Vref selectively against the voltage outputs of the calibrating DAC (e.g., DAC1) for calibration, and the voltage of the nodes (e.g., node 1 and node n) for testing. All of the nodes are tested in parallel. The various components, as illustrated, are not repeated but include the above-described circuit components that provide the described functionality.

In various embodiments, the calibrating DAC (e.g., DAC1) can be used for testing the analog circuit nodes. For testing of nodes, it can sometimes be beneficial to both stimulate and observe particular nodes. The one or more nodes can be stimulated with a defined voltage. For example, the ATB apparatus 442 includes a switch circuit 444 that selectively connects one of the plurality of node circuits (e.g., node 1) to the calibrating DAC circuit, during a test of the plurality of node circuits, to stimulate the one node circuit while measuring all of the nodes in parallel. Although the embodiments illustrates one switch circuit, various embodiments include a plurality of switch circuits.

Figure 5:
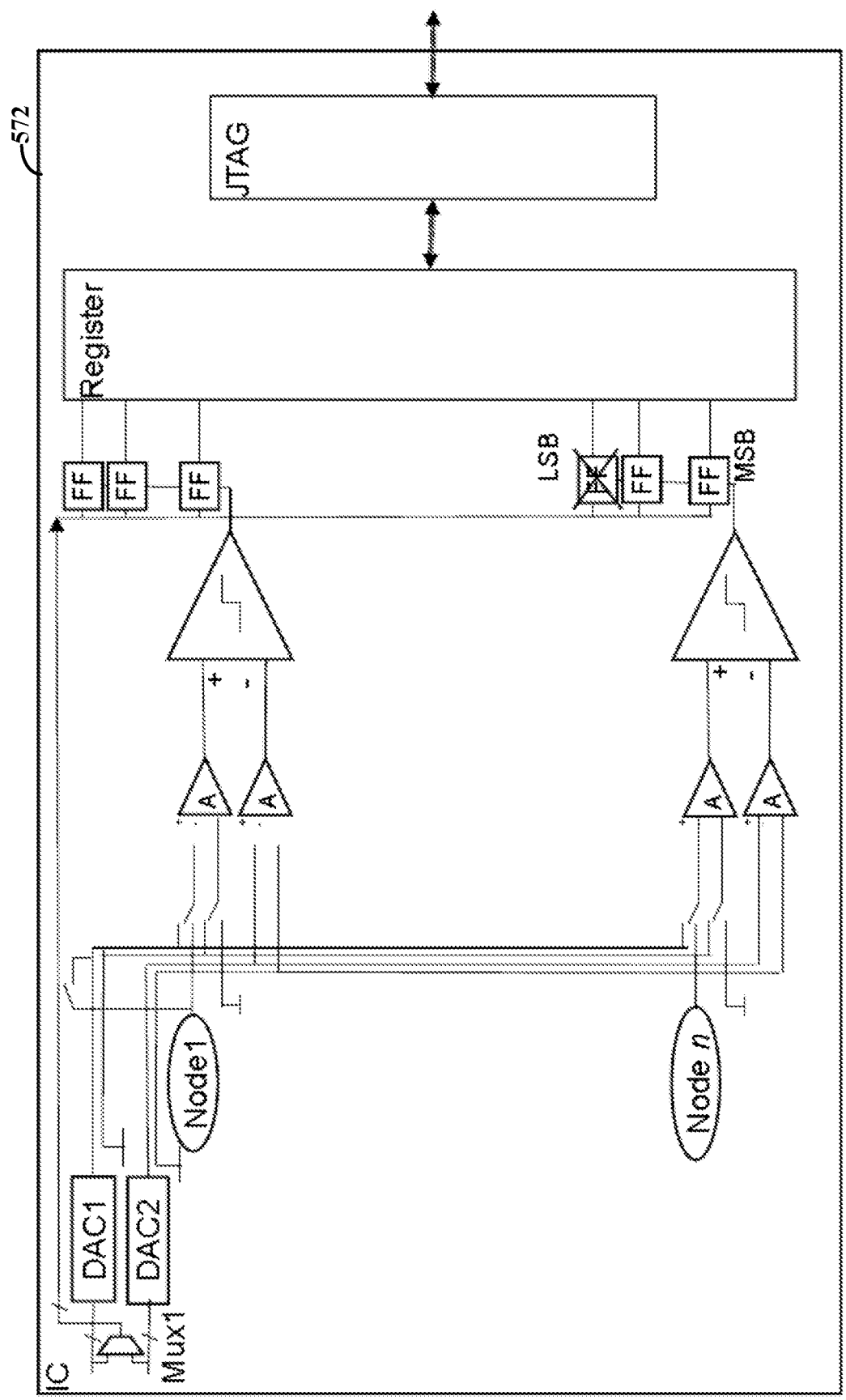
FIG. 5 illustrates an example of an ATB apparatus, in accordance with various embodiments.

FIG. 5 illustrates an example of an ATB apparatus, in accordance with various embodiments. The ATB apparatus 572 can include the components of the ATB apparatus 220 illustrated by FIG. 2 with the addition of flip-flop circuits and the components of the ATB apparatus 334 of FIG. 3, and the components and testing technique (e.g., stimulation) of the ATB apparatus 442. Although embodiments are not so limited and may not include the additional switch circuit for the stimulation of the one or more nodes during testing. That is, the ATB apparatus 572 includes an IC having a measuring DAC that provides the rising or falling Vref and comparators for comparing the Vref selectively against the voltage outputs of the calibrating DAC for calibration, and the voltage of the nodes for testing. All of the nodes is tested in parallel. The various components, as illustrated, are not repeated but include the above-described circuit components that provide the described functionality.

As illustrated, not all of the registers may be n-bit registers having n flip-flop circuits. As previously described, n equals the number of DAC input bits. In some embodiments, at least one of the plurality of comparators is associated with less than n flip-flop circuits. For example, one or more least signification bits (LSB) may not have a respective flip-flop circuit. The chip area and length of the transmission can be reduced by using less then n flip-flops for one or more of the comparators. In the specific illustrated, node N has a flip-flop circuit that is skipped/not included in the IC. Although the embodiment of FIG. 5 illustrates flip-flop circuits, embodiments are not so limited and can include latches and/or RAM cells, as previously described.

Other additional embodiments can include further refinements to the flip-flop circuits. For example, it may be appreciated that in many implementations, the node voltage that is of interest is within a window between an upper threshold and a lower threshold. Any value below the lower threshold can be too low, which may cause the IC to be rejected during production testing or a self-test. Likewise, any value above the upper threshold can be too high and can cause the IC to be rejected during testing. If the upper threshold is below half of the DACs maximum output voltage, then the most significant bits (MSB) register flip-flop circuit can be left out, provided that the respective register is read out before the DAC reaches half of its maximum output voltage. Similar savings of the register flip-flop circuits can be possible, e.g., if the lower threshold is above half of the DACs maximum output level. In such a manner, the chip area and the length of the transmission bit stream can be reduced and there may be no reduced accuracy of the nodes.

Figure 6A:
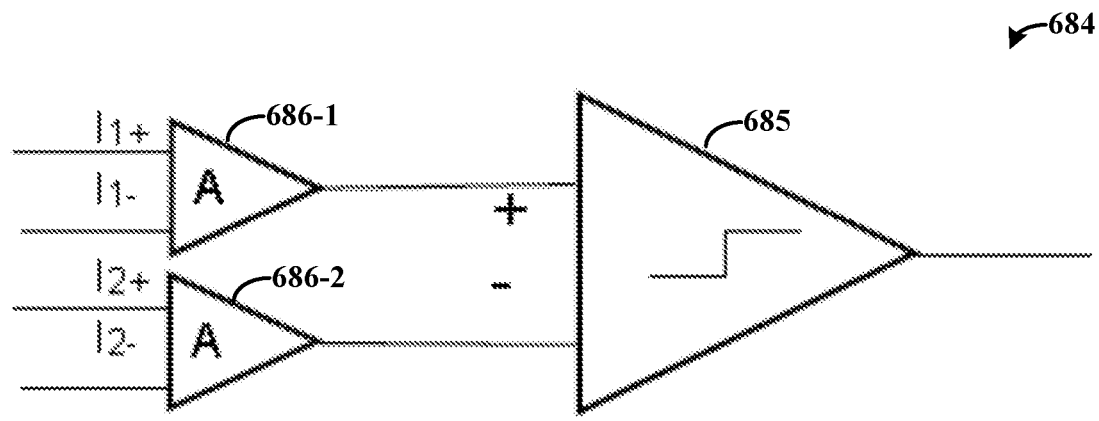
FIGS. 6A-6B illustrate example comparator circuits, in accordance with various embodiments.
Figure 6B:
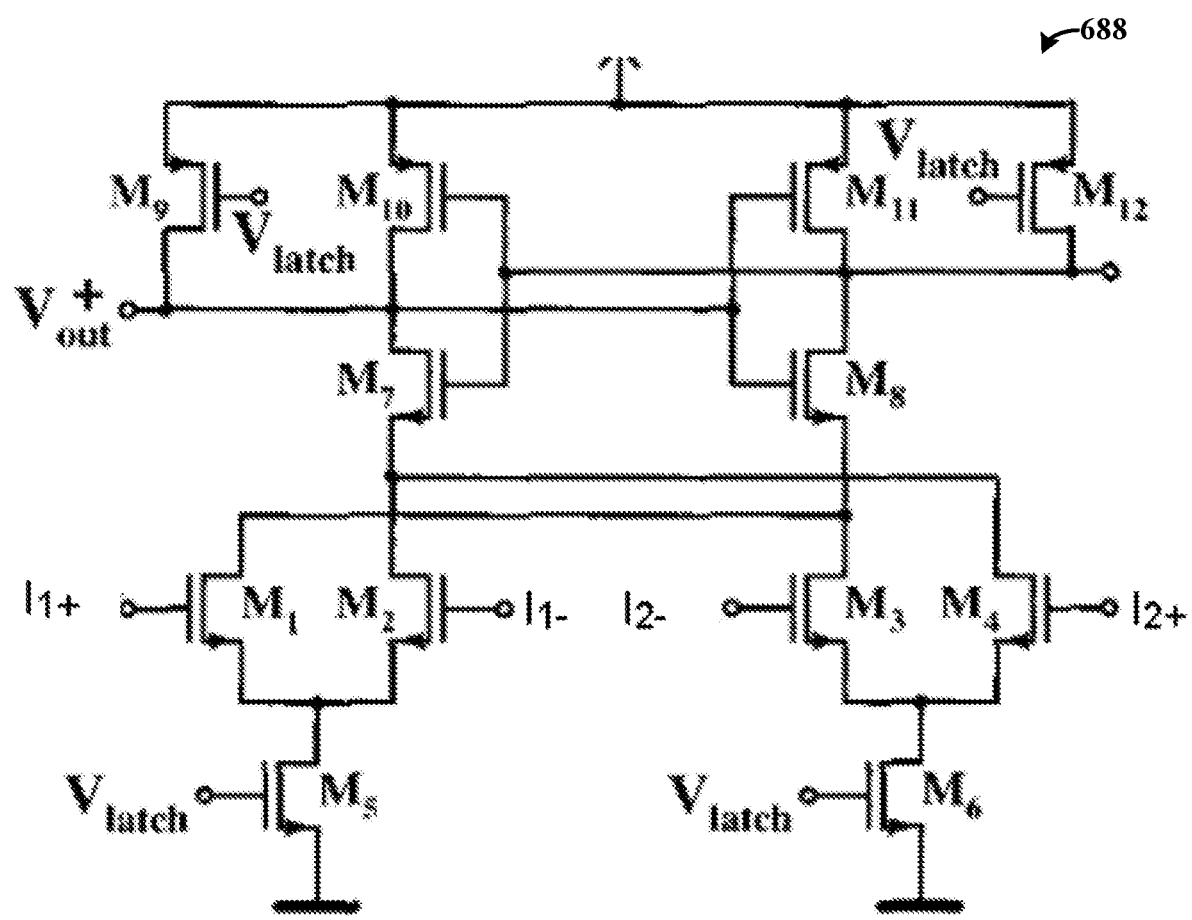

FIGS. 6A-6B illustrate example comparator circuits, in accordance with various embodiments. For example, FIG. 6A illustrates an example a comparator circuit 684 that includes differential-to-single amplifiers 686-1, 686-2 and a comparator 685 with inverting inputs and non-inverting inputs. One of the input ports of the comparator 685 is coupled to the differential reference lines of the measuring DAC via one of the amplifiers 686-1, 686-2 and the other input port of the comparator is coupled to either the differential reference lines of the calibrating DAC or the differential lines of the nodes via the other of the amplifiers 686-1, 686-2. FIG. 6B illustrates an example of differential comparators 688. The various comparators illustrated by FIGS. 1-5 can include one of the comparator circuits 684 or 688.

As may be appreciated, the various components and techniques discussed in each of FIGS. 1-6B can be used in different combinations and can include additional components. For example, the IC can include thousands of nodes which are tested in production testing and/or in the field, such as for functional safety where fast and precise measurement of node voltages can be beneficial. In some specific embodiments, the above described apparatuses can be used to comply with safety-sensitive protocols as the faults on the analog node circuits can be detected during operation of the apparatuses. In response to a detected fault, a dedicated action can occur, as previously described in connection with FIG. 1.

Figure 7A:
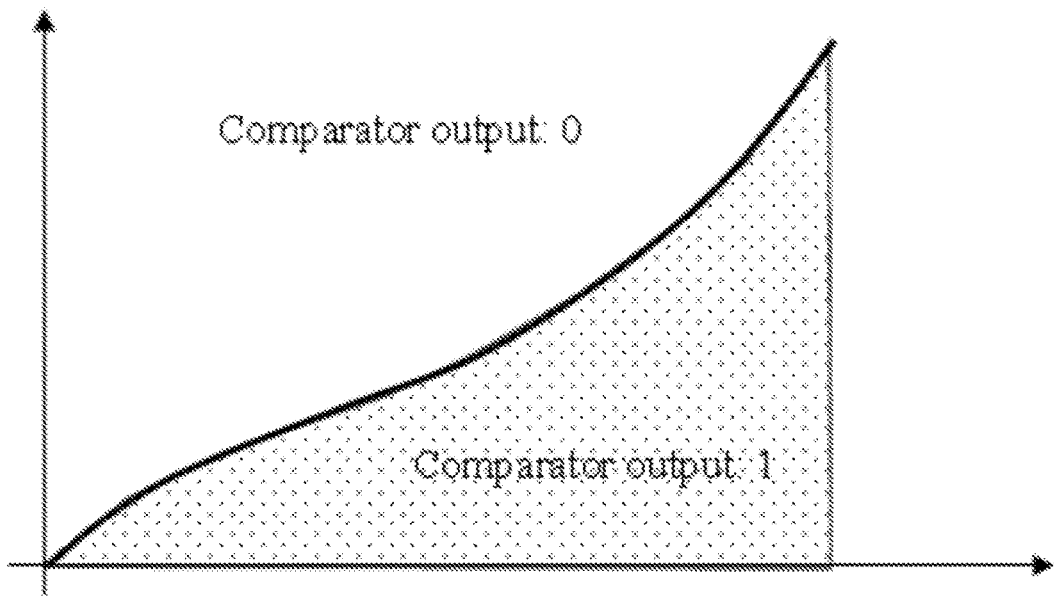
FIGS. 7A-7B illustrate an example of a set of calibration data for a comparator circuit, in accordance with various embodiments.
Figure 7B:
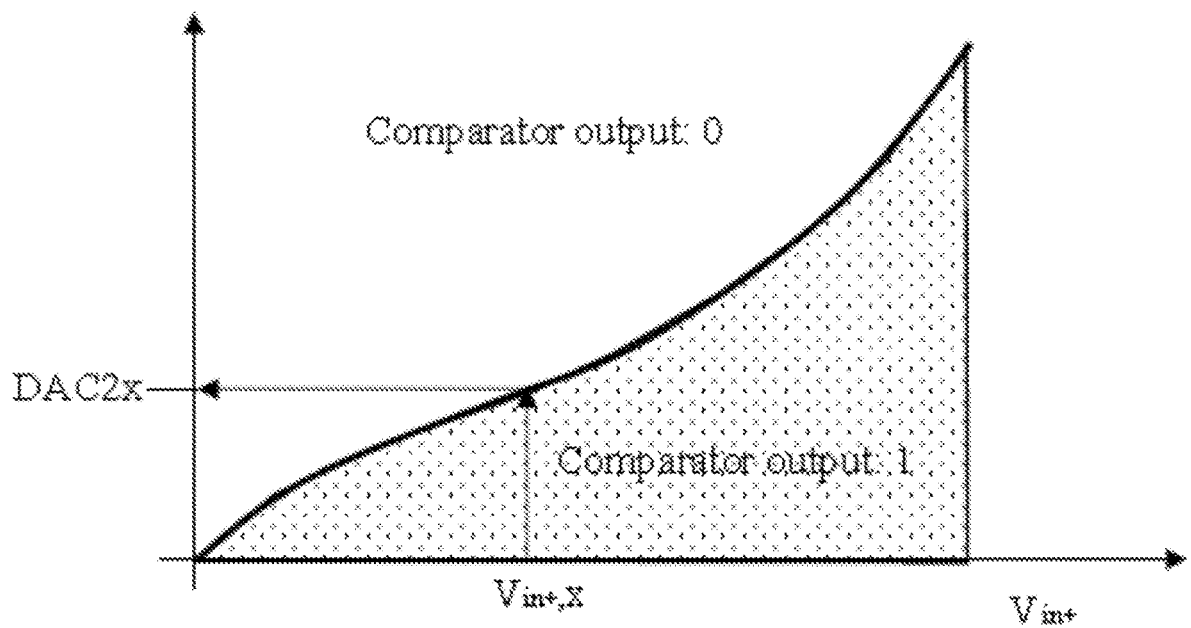

FIGS. 7A-7B illustrate examples of a set of calibration data for a comparator circuit, in accordance with various embodiments. More specifically, FIG. 7A illustrates an example calibration table that includes calibrating DAC input codes (e.g., DAC1 input code) and measuring DAC input codes (e.g., DAC2 input codes) and resulting comparator outputs. FIG. 7B illustrates an example of how to use the calibration table, as illustrated by FIG. 7A, to determine a node voltage $V_{in+x}$ based on the DAC2 input code (e.g., the input voltage Vref). The measuring DAC input codes (e.g., DAC2 input codes) are counted up (referring to the vertical arrow) until the comparator output switches from 1 to 0. The measuring DAC input code, in this case: DAC2x, refers to the voltage to be measured. In a previous calibration run, the table of input code versus output voltage of DAC2 has been established, which can be used to conclude from DAC2x to the DAC2 output voltage, which is equal to $V_{in+x}$ that is to be measured.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, nodes, and/or other circuit-type depictions (e.g., reference numerals 106-1, 106-N of FIGS. 1 and 224-1, 224-N and 230 of FIG. 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1-5. In certain embodiments, such a programmable circuit in one or more computer circuits, including memory circuitry for storing and accessing a program to be executed as a set (or sets) of instructions (and/or to be used as configuration data to define how the programmable circuit is to perform), and an algorithm or process as described herein is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first node" "second node" etc., where the node might be replaced with terms such as "circuit," "circuitry" and others, the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the circuit components illustrated by FIGS. 1-5 can include more or fewer components, such as FIG. 1 including components from FIG. 5. Such modifications do not depart from the true spirit and scope of various aspects of the disclosure, including aspects set forth in the claims.

What is claimed is:

1. An analog-test-bus (ATB) apparatus comprising:
a plurality of comparator circuits, each having an output port, and a pair of input ports of opposing polarity including an inverting port and a non-inverting port;
a plurality of circuit nodes configured and arranged to be selectively connected to the input ports of a first polarity;
at least one digital-to-analog converter (DAC) configured and arranged to drive the input ports of an opposite polarity of the first polarity of the plurality of comparator circuits; and
data storage and logic circuitry configured and arranged to account for inaccuracies attributable to the plurality of comparator circuits by providing, for each comparator circuit, a set of calibration data indicative of the inaccuracies for adjusting comparison operations performed by the plurality of comparator circuits.

2. The apparatus of claim 1, wherein the at least one DAC includes:
a first DAC configured and arranged to drive the plurality of comparator circuits using differential reference lines selectively connected to the input ports of the first polarity; and
a second DAC configured and arranged to drive the plurality of comparator circuits using differential reference lines connected to the input ports of the opposite polarity.

3. The apparatus of claim 1, wherein data storage and logic circuit is configured and arranged to provide the set of calibration data based on combinations of input codes of a first DAC and a second DAC and resulting comparator outputs for the combinations.

4. The apparatus of claim 1, wherein the data storage and logic circuitry is further configured and arranged to test the plurality of circuit nodes using the set of calibration data to further include mitigating inaccuracy of a transfer function of at least one of the plurality of comparator circuits.

5. The apparatus of claim 4, wherein the data storage and logic circuit is further configured and arranged to detect a fault responsive to the test and to perform a dedicated action selected from a group consisting of resetting the ATB apparatus, rebooting a system associated with the ATB apparatus, raising an error flag, and combinations thereof.

6. The apparatus of claim 1, wherein the data storage and logic circuitry is further configured and arranged to periodically calibrate the plurality of comparator circuits using respective comparator circuit outputs for combinations of input codes of a first DAC and a second DAC.

7. The apparatus of claim 1, wherein the plurality of comparator circuits further include at least one of differential-to-single amplifiers and differential comparators.

8. An analog-test-bus (ATB) apparatus comprising:
a plurality of comparator circuits, each having an output port, and a pair of input ports of opposing polarity including an inverting port and a non-inverting port;

a plurality of circuit nodes configured and arranged to be connected to the input ports of a first polarity;

a digital-to-analog converter (DAC) configured and arranged to drive the plurality of comparator circuits by connecting to the input ports of a second polarity, the second polarity opposite of the first polarity; and data storage and logic circuitry configured and arranged to account for inaccuracies attributable to the plurality of comparator circuits by using a set of calibration data indicative of the inaccuracy to adjust comparison operations performed by the plurality of comparator circuits.

9. The apparatus of claim 8, further including another DAC configured and arranged to drive the plurality of comparator circuits by selectively connecting to the input ports of the first polarity.

10. The apparatus of claim 8, wherein the data storage and logic circuitry is configured and arranged with the plurality of comparator circuits to test the plurality of circuit nodes by comparing outputs of the DAC to outputs of the plurality of circuit nodes and adjusting the comparison operations performed by the plurality of comparator circuits using the set of calibration data to mitigate the inaccuracies.

11. The apparatus of claim 8, further including a plurality of flip-flop circuits, latches or random-access memory (RAM) cells coupled to the output ports of the plurality of comparator circuits, the plurality of flip-flop circuits, latches, or RAM cells being configured and arranged to latch in response to a rising edge of an output at the output port of the comparator circuits, wherein an input code of the DAC is distributed over a digital bus having n-bits.

12. The apparatus of claim 11, wherein at least one of the plurality of comparator circuits is associated with a number of flip-flop circuits, latches or RAM cells less than the number of bits of the digital bus.

13. The apparatus of claim 8, wherein the data storage and logic circuitry is further configured and arranged to test the plurality of circuit nodes using the set of calibration data to further include mitigating inaccuracy of a transfer function of at least one of the plurality of comparator circuits.

14. The apparatus of claim 8, wherein the set of calibration data includes a table having combinations of input codes of the DAC and another DAC and resulting comparator outputs associated with the combinations.

15. An analog-test-bus (ATB) apparatus comprising:
a plurality of comparator circuits, each having an output port, and a pair of input ports of opposing polarity including an inverting port and a non-inverting port;

a first digital-to-analog converter (DAC) configured and arranged to drive the plurality of comparator circuits by connecting to input ports of a first polarity;

a second DAC configured and arranged to drive the plurality of comparator circuits by connecting to input ports of a second polarity opposite of the first polarity;

a plurality of circuit nodes configured and arranged to be selectively connected to the input ports of the first polarity; and data storage and logic circuitry configured and arranged to account for inaccuracies attributable to the plurality of comparator circuits by providing a set of calibration data indicative of the inaccuracies and by using the set of calibration data to adjust comparison operations performed by the plurality of comparator circuits.

16. The apparatus of claim 15, further including switch circuitry configured and arranged to selectively connect the first DAC to the input ports of the first polarity for calibration and selectively connect the plurality of circuit nodes to the input ports of the first polarity for testing the plurality of circuit nodes.

17. The apparatus of claim 15, wherein data storage and logic circuitry is configured and arranged to provide the set of calibration data based on combinations of input codes of the first DAC and the second DAC and resulting comparator outputs for each of the combinations.

18. The apparatus of claim 15, further including switch circuitry configured and arranged to selectively connect one of the plurality of node circuits to the first DAC, during a test of the plurality of node circuits, to stimulate the one node circuit.

19. The apparatus of claim 15, further including a plurality of flip-flop circuits, latches or random-access memory (RAM) cells coupled to the output ports of the plurality of comparator circuits, the plurality of flip-flop circuits, latches or RAM cells being configured and arranged to latch in response to a rising edge of an output at the output port of the comparator circuits.

20. The apparatus of claim 19, wherein the DAC input code is distributed over a digital bus having n-bits and at least one of the plurality of comparator circuits is associated with fewer flip-flop circuits, latches or RAM cells than the number of bits of the digital bus.

* * * * *